(12) United States Patent
Karpman

(10) Patent No.: US 6,555,904 B1
(45) Date of Patent: Apr. 29, 2003

(54) ELECTRICALLY SHIELDED GLASS LID FOR A PACKAGED DEVICE

(75) Inventor: Maurice S. Karpman, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/799,841

(22) Filed: Mar. 5, 2001

(51) Int. Cl.[7] .............................................. H01L 23/12
(52) U.S. Cl. ...................................... 257/704; 257/433
(58) Field of Search ................................. 257/659, 660, 257/433, 434, 680, 704

(56) References Cited

U.S. PATENT DOCUMENTS

| | | | |
|---|---|---|---|
| 5,583,350 A | * | 12/1996 | Norman et al. |
| 5,751,009 A | * | 5/1998 | Anderson et al. |
| 5,930,276 A | * | 7/1999 | Dou et al. |
| 6,052,197 A | | 4/2000 | Drake |
| 6,059,188 A | * | 5/2000 | Difazio et al. |
| 6,088,474 A | | 7/2000 | Dudasko et al. |

OTHER PUBLICATIONS

"Ceramic Blade Probes"; data sheet of Cerprobe Corp.; Cerprobe Corporation, 1150 N. Fiesta Blvd., Gilbert, AZ 85233; Mar., 2000.

"CerCard Probe Cards: Advanced Cantilever Technology"; article from Cerprobe Corp., 1150 N. Fiesta Blvd., Gilbert, AZ 85233; Mar., 2000.

"Near IR Sensitive Liquid Crystal Light Valve with Hydrogenated Amorphous Silicon Photoconductor"; by Piyi Du et al.; IEEE Transactions on Electron Devices, vol. 43, No. 2; Feb. 1996; pp. 360–362.

"A Micromachined Angled Hall Magnetic Field Sensor Using Novel In–Cavity Patterning"; by M. Paranjape et al.; Transducers '97; IEEE; 1997 International Conference on Solid–State Sensors and Actuators, Chicago; Engineering Information Inc., Hoboken, New Jersey 07030; pp. 397–400.

* cited by examiner

*Primary Examiner*—Sheila V. Clark
(74) *Attorney, Agent, or Firm*—Samuels, Gauthier & Stevens, LLP

(57) ABSTRACT

A packaged device includes a package substrate and a plurality of optical structures formed on a semiconductive substrate and positioned on the package substrate, forming an active area. The packaged device further includes a contiguous solderable seal structure surrounding the plurality of optical structures and a cap formed over the plurality of optical structures and upon the contiguous solderable seal structure. The cap has, formed thereon, patterned metalization. The patterned metalization is located over the active area.

31 Claims, 4 Drawing Sheets

ELECTRICALLY SHIELDED GLASS LID FOR A PACKAGED DEVICE

FIELD OF THE INVENTION

The present invention relates generally to providing an electrically shielded cover for a packaged optical device. More particularly, the present invention relates to providing an electrically shielded glass lid for an optical micro electromechanical system (MEMS) package.

BACKGROUND OF THE INVENTION

Conventionally, semiconductive wafer based devices such as optical micro electromechanical systems ("MEMS") are produced using a variety of methods of fabrication. Notwithstanding the process of fabrication, the produced MEMS requires a cap or lid to protect the MEMS from environmental insult, such an undesirable humidity. Such caps have been typically glass lids that provide both the environmental protection and provide an optical window for the optical devices in a MEMS package.

However, conventional glass lids have one disadvantage in that conventional glass lids are typically dielectrics that can have electrostatic energy build up upon them. The built up electrostatic energy can result in an electrostatic discharge that can damage the optical MEMS devices. Moreover, the build up of electrostatic energy can produce local electrical fields that may distort the optical MEMS devices, especially if these devices are sensors.

In one solution to counter this disadvantage, a conventional glass cover would be located far enough from the optical devices so that the air gap would be large enough to prevent a discharge. Moreover, the large air gap would cause the locally generated electrical fields to be minimally weak around the optical devices. Although these conventional devices would provide an optical device shielded from the environment and protect from electrostatic discharge and locally generated electrical fields, the package surrounding the optical device would large and thus costly and not small enough to be used in many applications. Furthermore the large air gap creates a long optical or focal length that could keep the optical device from being used in certain applications.

In another solution to counter this disadvantage, a conventional glass cover would be covered with a thin transparent film of transparent electrodes. The transparent electrodes provide an electrical path for the electrostatic energy to be drained off the glass cover. Although the transparent electrodes provide protection against electrostatic insult to the optical device, the transparent film and transparent electrodes are not absolutely transparent. Using such a solution for electrostatic protection causes undesirable light loss. Such light loss is unacceptable in such applications as fiber optic telecommunication systems. More specifically, telecommunication applications using optical communication are starved for light due to light loss along the fiber optic network, thus any light loss, even a small percentage of loss, can significantly impact the application in a negative manner.

Moreover, the use of transparent electrodes and thin films hinders the use of optical MEMS devices with certain wavelengths of light. For example, some transparent electrodes do not transmit well in the UV spectrum. This is significant when the optical MEMS devices may be used in conjunction with an EPROM that uses UV light to enable programming of the EPROM.

The present invention provides a glass lid for an optical MEMS package, while avoiding the disadvantages of the conventional devices. More specifically, the present invention prevents an electrostatic discharge and reduces or eliminates any undesirable locally generated electrical fields. The present invention also provides protection from the environment, such as humidity, while providing an optical window for the optical MEMS devices wherein the light loss is greatly reduced to-an insignificant level or eliminated. Lastly, the packaging of the optical MEMS is greatly reduced by the present invention, thereby reducing costs and expanding the applications for the optical MEMS package.

SUMMARY OF THE INVENTION

One aspect of the present invention is a packaged device. The packaged device includes a package substrate; a plurality of optical structures formed on a semiconductive substrate and positioned on the package substrate, forming an active area; a contiguous solderable seal structure surrounding the plurality of optical structures; and a cap formed over the plurality of optical structures and upon the contiguous solderable seal structure. The cap has, formed thereon, patterned metalization. The patterned metalization is located over the active area.

Another aspect of the present invention is a metalized glass lid for an optical die. The metalized glass lid includes a glass portion and a metalization adjacent to the glass portion. The metalization has clear apertures and is connected to a DC voltage.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE INVENTION

Figure 1:
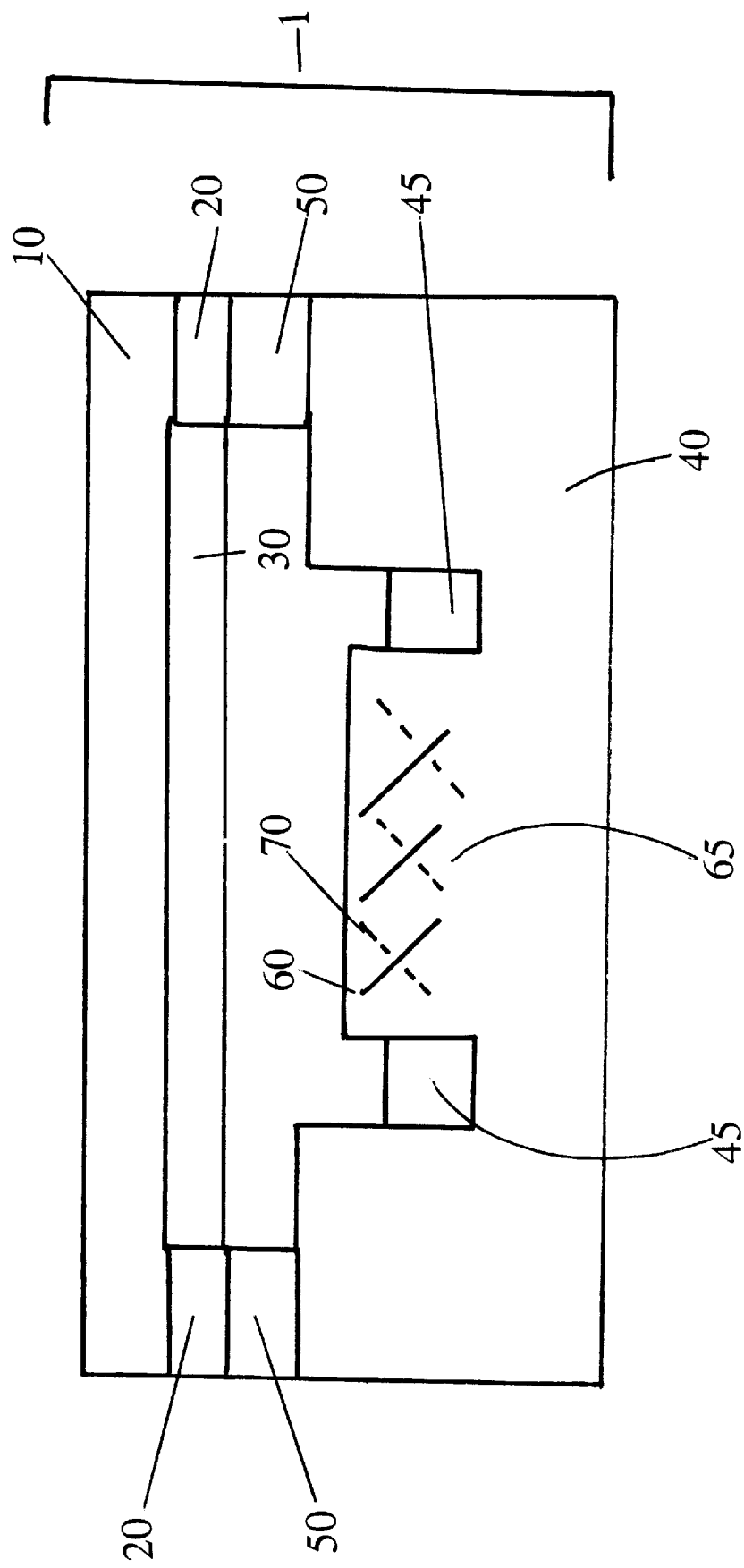
FIG. 1 is a graphical representation of an optical MEMS package according to the present invention.

As noted above, the present invention is directed to an optical MEMS package that includes a glass lid or cover that provides both environmental and electrostatic insult protection. FIG. 1 illustrates an embodiment according to the concepts of the present invention.

As illustrated in FIG. 1, an optical MEMS package 1 includes a package substrate 40 which can provide a base or foundation for an optical MEMS die 65. The optical MEMS die 65 is attached to the package substrate 40 through wire bonds 45. Upon the package substrate 40, deposited solder performs 50 are formed to receive deposited performs 20 located on a glass lid or cover 10 to provide a soldered seal around the optical devices on the optical MEMS die 65 within the optical MEMS package 1.

The optical MEMS devices are represented by references 60 and 70. In this illustration, the optical MEMS devices are mirrors that are able to rotate to various positions based upon received control signals. The optical MEMS devices can also be sensors on any other optical MEMS device. In FIG. 1, the mirror can be placed in one of a plurality of positions as represented by reference 60, or it could be placed in another of a plurality of positions as represented by reference 70.

The glass lid or cover 10 includes thereon a patterned metalization layer 30. The patterned metalization layer 30 may be located on either side of the glass lid or cover 10. In a preferred embodiment, the patterned metalization layer 30 is located within the hermitically seal environment to protect it from wear and damage. Moreover, the patterned metalization layer 30 can be electrically coupled to a DC voltage source or electrical ground through the deposited solder perform 20 or the deposited solder perform 50. The DC voltage source provides the electrostatic protection for the optical MEMS package and devices therein.

Figure 4:
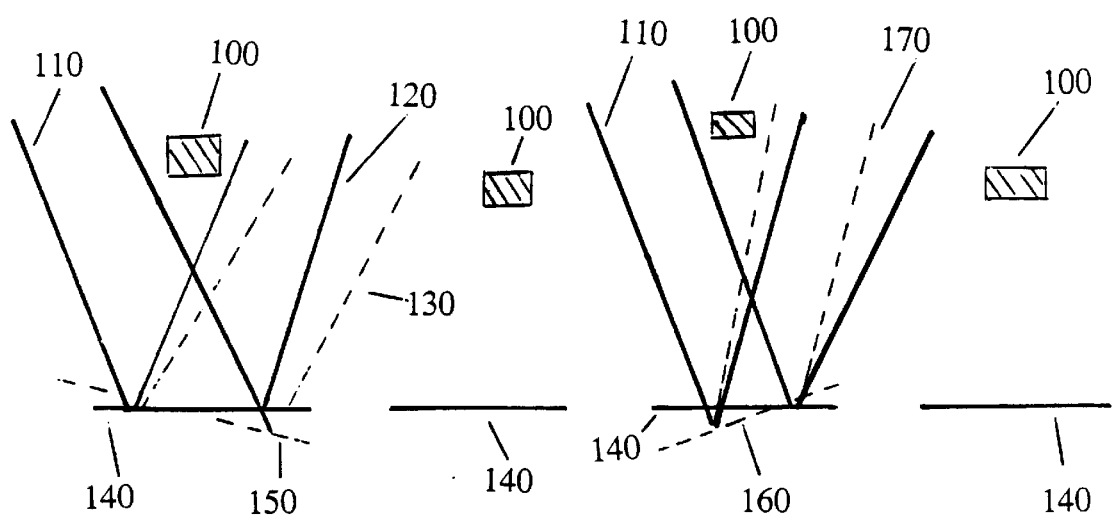
FIG. 4 a graphical representation of optical MEMS devices interacting with a patterned metalization formed upon a glass lid according to the present invention.

In an optical MEMS package, as illustrated in FIG. 4, light 110 enters the package is incident upon, in this example, a plurality of mirrors angled at various positions depending upon the control signals received by the individual MEMS devices. For example, as shown in FIG. 4, an individual MEMS device, such as a mirror, may be positioned in one state as illustrated by mirror position 140, or the same mirror can be positioned at another of a plurality of positions as illustrated by mirror positions 150 or 160. The light 110 passes a portion of a patterned metalization layer 100 before encountering the individual MEMS device. The reflected light 120, from mirror position 140, passes by the patterned metalization layer 100 before exiting the optical MEMS device package.

As noted above, the mirrors can also be positioned differently. For example, a mirror can be positioned as illustrated in FIG. 4 by mirror position 150 or by mirror position 160. Light 110 enters the package is incident upon either of these mirror positions 150 or 160. The light 110 passes a portion of a patterned metalization layer 100 before encountering the individual MEMS device. The reflected light 130, from mirror position 150, or the reflected light 170, from mirror position 160, pass by the patterned metalization layer 100 before exiting the optical MEMS device package.

Figure 2:
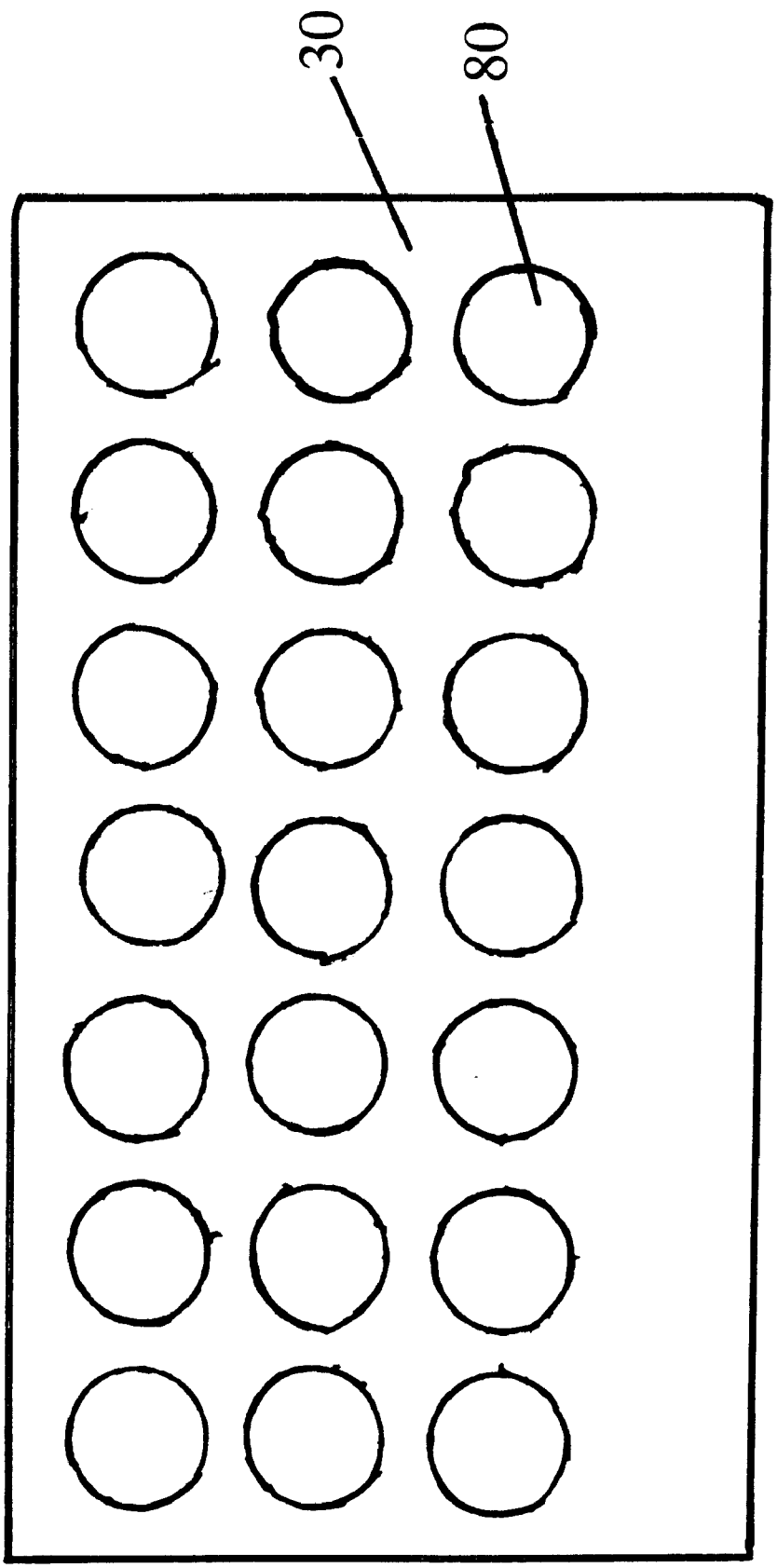
FIG. 2 is a graphical representation of patterned metalization upon a glass lid according to one embodiment of the present invention.

The patterned metalization may be realized by a metal layer formed over a glass lid. An example of such a metal layer is illustrated in FIG. 2. In FIG. 2, the metal layer is a solid metal layer 30 having apertures 80 formed therein. The apertures 80 are aligned so as to allow the optical MEMS device to interact with the light being received by the optical MEMS package. The apertures 80 of FIG. 2 allow the light to pass therethrough without interference and without light loss, while preventing electrostatic discharge between the glass lid and the optical MEMS devices. The apertures 80 of FIG. 2 may vary in size depending upon the application of the optical MEMS package.

Figure 3:
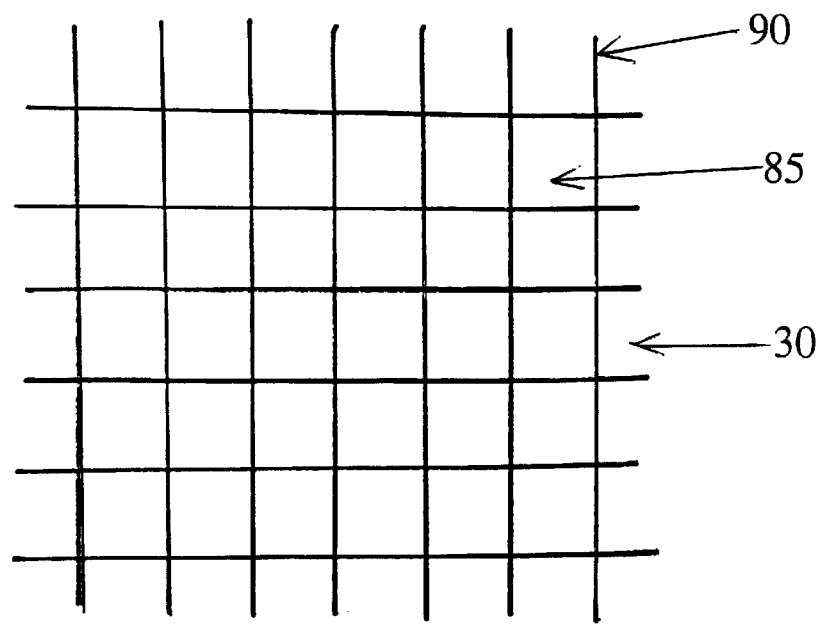
FIG. 3 is a graphical representation of patterned metalization upon a glass lid according to another embodiment of the present invention.

The patterned metalization may also be realized by a thin metal mesh formed over a glass lid. An example of such a thin metal mesh is illustrated in FIG. 3. In FIG. 3, the metal layer is a plurality of thin wires 90 in a grid-like pattern. The pattern provides openings 85 between the grid of thin wires 90. The wires 90 can be very thin metal conductors, thus allowing the optical MEMS package to realize a very dense population of optical MEMS devices because the light is not occluded by the grid structure. The wires 90 are aligned so as to allow the optical MEMS device to interact with the light being received by the optical MEMS package. The wires 90 of FIG. 3 allow the light to pass therethrough without interference and without light loss, while preventing electrostatic discharge between the glass lid and the optical MEMS devices. The openings 85 of FIG. 3 may vary in size depending upon the application of the optical MEMS package.

Figure 5:
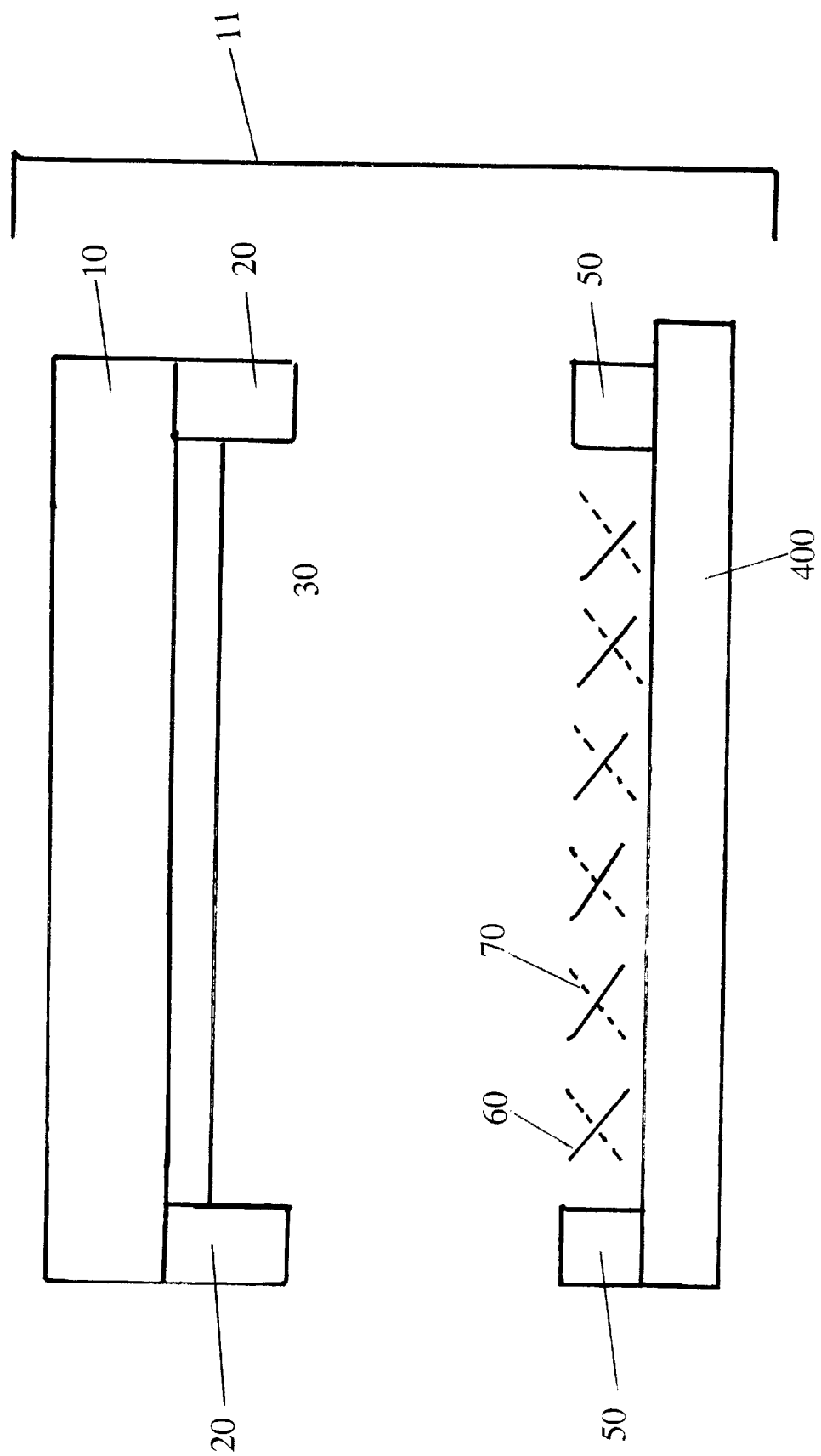
FIG. 5 is a graphical representation of an optical MEMS package according to another embodiment of the present invention.

FIG. 5 illustrates another embodiment according to the concepts of the present invention. As illustrated in FIG. 5, an optical MEMS die 11 includes a semiconductive substrate 400 that provides a base or foundation for the optical devices. Upon the semiconductive substrate 400, deposited solder performs 50 are placed to receive deposited performs 20 located on a glass lid or cover 10 to provide a soldered seal around the optical devices formed on the optical MEMS die 11.

The optical MEMS devices are represented by references 60 and 70. In this illustration, the optical MEMS devices are mirrors that are able to rotate to various positions based upon received control signals. The optical MEMS devices can also be sensors on any other optical MEMS device. In FIG. 5, the mirror can be placed in one of a plurality of positions as represented by reference 60, or it could be placed in another of a plurality of positions as represented by reference 70.

The glass lid or cover 10 includes thereon a patterned metalization layer 30. The patterned metalization layer 30 may be located on either side of the glass lid or cover 10. In a preferred embodiment, the patterned metalization layer 30 is located within the hermitically seal environment to protect it from wear and damage. Moreover, the patterned metalization layer 30 can be electrically coupled to a DC voltage source or electrical ground through the deposited solder perform 20 or the deposited solder perform 50. The DC voltage source provides the electrostatic protection for the optical MEMS die 11 and devices therein.

As noted above, the present invention is directed to a packaged device having a package substrate; a plurality of optical structures formed on a semiconductive substrate and positioned on the package substrate, forming an active area; a contiguous solderable seal structure surrounding the plurality of optical structures; and a cap formed over the plurality of optical structures and upon the contiguous solderable seal structure. The cap has, formed thereon, patterned metalization. The patterned metalization is located over the active area.

The optical structures may be a plurality of moveable optical mirrors. Moreover, the cap is a glass lid. In one embodiment, the patterned metalization is a solid metal layer having clear apertures therein, the clear apertures being located to enable light from a source external of the cap to be incident upon the optical structures. The apertures are also located to enable light to be reflected from the optical mirrors to pass through the cap.

In another embodiment, the optical structures are a plurality of optical sensors. In a further embodiment, the plurality of optical structures from optical micro electromechanical system devices.

In a preferred embodiment, the patterned metalization is electrically coupled to a DC voltage source through the contiguous solderable seal structure or coupled directly thereto. The patterned metalization may also be a metallic mesh or a grid of thin metal wires having clear apertures therein or openings therebetween. The clear apertures or openings are located to enable light from a source external of the cap to be incident upon the optical structures. The apertures or openings are also located to enable light to be reflected from the optical mirrors to pass through the cap.

The patterned metalization prevents electrostatic discharge between the cap and the semiconductive substrate having the optical devices formed thereon. The patterned metalization is can also be positioned between the cap and the plurality of optical structures.

In another embodiment of the present invention, a metalized glass lid for an optical die includes a glass portion and a metalization adjacent to the glass portion. The metalization has clear apertures and is coupled to a DC voltage.

In the preferred embodiment, the optical die is in a lidded package, but the lid can be soldered directly to the optical die.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A packaged device, comprising:
   a package substrate;
   a plurality of optical structures formed on a semiconductive substrate and positioned on said package substrate, forming an active area;
   a contiguous solderable seal structure surrounding said plurality of optical structures; and
   a cap formed over said plurality of optical structures and upon said contiguous solderable seal structure;
   said cap having, formed thereon, patterned metalization, said patterned metalization being located over said active area.

2. The packaged device as claimed in claim 1 wherein said optical structures are a plurality of moveable optical mirrors.

3. The packaged device as claimed in claim 1, wherein said cap is a glass lid.

4. The packaged device as claimed in claim 1, wherein said patterned metalization is a solid metal layer having clear apertures therein, said clear apertures being located to enable light from a source external of said cap to be incident upon the optical structures.

5. The packaged device as claimed in claim 1, wherein said optical structures are a plurality of optical sensors.

6. The packaged device as claimed in claim 2, wherein said patterned metalization is a solid metal layer having clear apertures therein, said clear apertures being located to enable light to be incident upon the optical structures, said apertures being located to enable light to be reflected from the optical mirrors to pass through said cap.

7. The packaged device as claimed in claim 3, wherein said patterned metalization is a metal layer having clear apertures therein, said clear apertures being located to enable light from a source external of said cap to be incident upon the optical structures.

8. The packaged device as claimed in claim 3, wherein said optical structures are a plurality of optical sensors.

9. The packaged device as claimed in claim 7, wherein said patterned metalization is a solid metal layer having clear apertures therein, said clear apertures being located to enable light to be incident upon the optical structures, said apertures being located to enable light to be reflected from the optical mirrors to pass through said cap.

10. The packaged device as claimed in claim 1, wherein said patterned metalization is electrically coupled to said contiguous solderable seal structure.

11. The packaged device as claimed in claim 1, wherein said patterned metalization is a metallic mesh having clear apertures therein, said clear apertures being located to enable light from a source external of said cap to be incident upon the optical structures.

12. The packaged device as claimed in claim 1, wherein said patterned metalization is a grid of thin metal wires having clear openings therebetween, said clear openings being located to enable light from a source external of said cap to be incident upon the optical structures.

13. The packaged device as claimed in claim 1, wherein said patterned metalization prevents electrostatic discharge between said cap and said semiconductive substrate having said optical structures formed thereon.

14. The packaged device as claimed in claim 1, said patterned metalization is positioned between said cap and said plurality of optical structures.

15. The packaged device as claimed in claim 1, wherein said plurality of optical structures from optical micro electromechanical system devices.

16. The packaged device as claimed in claim 1, wherein said patterned metalization is electrically coupled to a DC voltage source.

17. The packaged device as claimed in claim 9, wherein said patterned metalization is electrically coupled to a DC voltage source.

18. The packaged device as claimed in claim 11, wherein said patterned metalization is electrically coupled to a DC voltage source.

19. The packaged device as claimed in claim 12, wherein said patterned metalization is electrically coupled to a DC voltage source.

20. The packaged device as claimed in claim 13, wherein said patterned metalization is electrically coupled to a DC voltage source.

21. A metalized glass lid for an optical die, comprising:
    a glass portion; and
    a metalization adjacent to said glass portion;
    said metalization having clear apertures;
    said metalization being connected to a DC voltage.

22. The metalized glass lid for an optical die as claimed in claim 21, wherein the optical die is in a lidded package.

23. The metalized glass lid for an optical die as claimed in claim 21, wherein the metalized glass lid is soldered directly to a package containing the optical die.

24. An optical device, comprising:
    a plurality of optical structures formed on a semiconductive substrate, said plurality of optical structures forming an active area; and
    a cap formed over said plurality of optical structures;
    said cap having, formed thereon, patterned metalization, said patterned metalization being located over said active area.

25. The optical device as claimed in claim 24, wherein said optical structures are a plurality of moveable optical mirrors.

26. The optical device as claimed in claim 24, wherein said cap is a glass lid.

27. The optical device as claimed in claim 24, wherein said patterned metalization is a solid metal layer having clear apertures therein, said clear apertures being located to enable light from a source external of said cap to be incident upon the optical structures.

28. The optical device as claimed in claim 24, wherein said patterned metalization is a metallic mesh having clear apertures therein, said clear apertures being located to enable light from a source external of said cap to be incident upon the optical structures.

29. The optical device as claimed in claim 24, wherein said patterned metalization is a grid of thin metal wires having clear openings therebetween, said clear openings being located to enable light from a source external of said cap to be incident upon the optical structures.

30. The optical device as claimed in claim 24, wherein said patterned metalization prevents electrostatic discharge between said cap and said semiconductive substrate having said optical structures formed thereon.

31. The optical device as claimed in claim 24, wherein said patterned metalization is electrically coupled to a DC voltage source.

* * * * *